United States Patent
Griffiths et al.

(10) Patent No.: US 7,489,202 B1
(45) Date of Patent: Feb. 10, 2009

(54) RF AMPLIFIER WITH STACKED TRANSISTORS, TRANSMITTING DEVICE, AND METHOD THEREFOR

(75) Inventors: James R. Griffiths, Chandler, AZ (US); David M. Gonzalez, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 29 days.

(21) Appl. No.: 11/841,497

(22) Filed: Aug. 20, 2007

(51) Int. Cl.
*H03F 3/04* (2006.01)
(52) U.S. Cl. ........................... 330/311; 330/310
(58) Field of Classification Search ............. 330/311, 330/310, 285, 296
See application file for complete search history.

(56) References Cited

U.S. PATENT DOCUMENTS

| | | | |
|---|---|---|---|
| 6,462,620 B1 | 10/2002 | Dupuis et al. | |
| 6,504,431 B2 | 1/2003 | Weber et al. | |
| 6,570,450 B2 | 5/2003 | Nilson et al. | |
| 6,822,518 B1 | 11/2004 | Lin et al. | |
| 6,850,117 B2 | 2/2005 | Weber et al. | |
| 6,850,120 B2 * | 2/2005 | Heima et al. | 330/311 |
| 6,927,634 B1 | 8/2005 | Kobayashi | |
| 6,940,353 B2 | 9/2005 | Moraveji | |
| 7,023,272 B2 * | 4/2006 | Hung et al. | 330/126 |
| 7,053,718 B2 | 5/2006 | Dupuis et al. | |
| 7,135,925 B2 * | 11/2006 | Poulton | 330/253 |
| 7,352,247 B2 * | 4/2008 | Oh et al. | 330/311 |
| 7,391,269 B2 * | 6/2008 | Chiba | 330/311 |
| 2002/0101284 A1 | 8/2002 | Kee et al. | |
| 2003/0155980 A1 | 8/2003 | Heima et al. | |
| 2006/0226905 A1 | 10/2006 | Dupuis et al. | |

FOREIGN PATENT DOCUMENTS

WO    WO 03/079543 A1    9/2003

* cited by examiner

*Primary Examiner*—Henry K Choe
(74) *Attorney, Agent, or Firm*—Meschkow & Gresham PLC

(57) ABSTRACT

An RF transmitting device (10) includes an RF amplifier (22) formed having components formed on a common semiconductor substrate (14). RF amplifier (22) includes MOS transistors (42) and (44) and an RF choke (46) stacked between a ground node (32) and a $V_{dd}$ node (36). Transistors (42) and (44) are directly connected together and are biased by a control terminal bias network (58) so that the voltages appearing across their conduction terminals are about equal. Control terminals (56) and (62) of transistors (42) and (44) are driven by in-phase versions of an RF input signal (20).

20 Claims, 2 Drawing Sheets

RF AMPLIFIER WITH STACKED TRANSISTORS, TRANSMITTING DEVICE, AND METHOD THEREFOR

TECHNICAL FIELD OF THE INVENTION

The present invention relates generally to RF amplifiers. More particularly, the present invention relates to RF amplifiers that occupy a small area, to RF amplifiers that may be used in both linear and nonlinear applications, and to RF amplifiers implemented using transistors formed following standard processes that may be characterized by low breakdown voltages.

BACKGROUND OF THE INVENTION

Portable radio frequency (RF) transmitting devices, including cellular phones, portable radios, wireless modems, wireless routers, blue-tooth devices, and the like, are often energized by batteries. Currently, lithium-ion (Li-ion), nickel-cadmium (NiCd), nickel metal hydride (NiMH), and alkaline batteries in configurations that produce an operational voltage in the range of 3-7 Vdc when fully charged are popular for use in portable RF transmitting devices.

Portable RF transmitting devices are often mass produced for competitive markets. In other words, a vast multiplicity of a given make and model of an RF transmitting device is likely to be manufactured and widely distributed to the consuming public as inexpensively as possible. Accordingly, a need exists for RF transmitting devices that are easily compatible with the popular styles of batteries used in RF transmitting devices, inexpensive, yet robust and reliable.

In an attempt to meet this need, mass market RF transmitting devices tend to incorporate integrated circuits that include as many different functions on a single IC as practical and are manufactured using processes that achieve reliable results at a high yield. One such process is a complementary metal oxide semiconductor (CMOS) process. Standard CMOS processes are highly desired for use in forming RF transmitting device circuits because the resulting circuits tend to be reliable, robust, and relatively inexpensive.

One challenge of using standard CMOS processes for the formation of an RF amplifier portion of an RF transmitting device concerns the low breakdown voltages that characterize standard CMOS processes. In particular, low transistor breakdown voltages in the range of 2.8-3.6 volts routinely result from the adherence to standard CMOS processes. But this low breakdown voltage is not easily compatible with the batteries popularly used in portable RF transmitting devices. Additional circuits, techniques, and/or non-standard processes are conventionally used to accommodate the relatively high voltage delivered by the currently popular batteries. But these additional circuits, techniques and/or non-standard processes lead to increased costs.

A conventional RF amplifier configuration for a portable RF transmitting device may use Si bipolar, SiGe HBT, GaAs HBT, and/or other transistor formation processes. These transistor formation processes can result in higher breakdown voltages better matched to popular battery voltages. Unfortunately, each of these processes increases costs when compared to a standard CMOS process.

Costs are increased in at least two ways, transistor area and support circuitry, which dramatically drive up costs. For example, a large number of RF chokes (i.e., inductors) and large-valued bypass capacitors tend to be used in RF amplifiers that use these types of transistors for their active components. The excessive use of chokes and/or large bypass capacitors consumes precious semiconductor substrate area, leading to further increases in costs.

A conventional RF amplifier configuration for an RF transmitting device may alternatively use a metal oxide semiconductor (MOS) transistor for the active component of an RF amplifier, but limit its voltages using a voltage regulation circuit. This technique is also undesirable because the inclusion of a voltage regulator increases semiconductor substrate area and thereby increases costs. Moreover, a voltage regulator is likely to be an inefficient section which wastes power, and the wasting of power is highly undesirable in a battery-powered device.

Another technique conventionally used to adapt CMOS processes to a battery-powered, RF amplifier application stacks MOS transistors so that the available voltage is distributed across transistors in the stack.

One conventional version of this stacked-transistor technique forms a modified cascode amplifier, where a common gate transistor configuration is stacked with a common source transistor configuration, the common source transistor is driven with an RF input signal, and the gate biasing of the common gate transistor is modified so that the total voltage at DC is evenly distributed across the transistors. But this version suffers from undesirably low gain, undesirably low output impedance, and it fails to maintain an even distribution of voltage across the transistors. Low gain is a challenge when using any CMOS technique to form an RF amplifier, so the lower-gain amplification techniques are particularly unwelcome. The low gain and low impedance characteristics may be addressed using known techniques, but in addressing these characteristics even more semiconductor substrate area is consumed. And, to the extent that voltage distribution is uneven under RF conditions, the risk of catastrophic failure due to exceeding the breakdown voltage on the transistor with the greatest voltage increases.

Another conventional version of the stacked-transistor technique is particularly unsuited for a linear amplification application. This technique uses multiple inductors in the transistor stack and concurrently switches the different transistors using out-of-phase versions of the RF input signal. Resorting to the use of many inductors in an RF amplifier design is undesirable because inductors consume an inordinate amount of semiconductor substrate area. And, when many inductors are used the RF amplifier size increases considerably. Moreover, RF amplifiers that fail to operate in linear amplification applications are undesirable because many of the more modern modulation standards call for amplification to a high degree of linearity.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
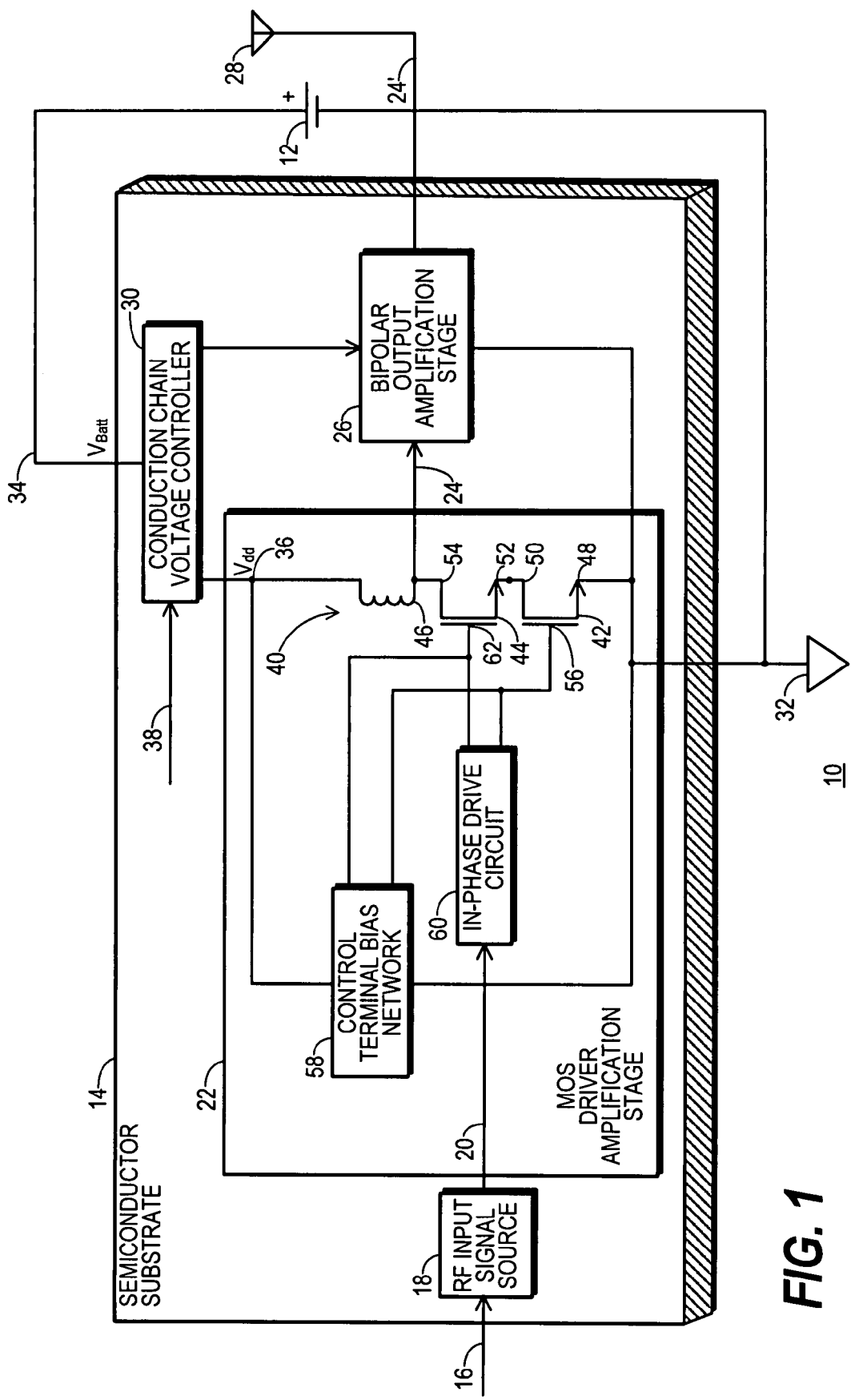
FIG. 1 shows a block diagram of an RF transmitting device configured in accordance with one embodiment of the present invention.

FIG. 1 shows a block diagram of a radio-frequency (RF) transmitting device 10 configured in accordance with one embodiment of the present invention. In one embodiment, RF transmitting device 10 is energized by a battery 12. RF transmitting device 10 may be configured as a cellular telephone, portable radio, wireless modem, wireless router, blue-tooth device, or in accordance with any other battery-powered or other RF transmitter application.

Battery 12 may be configured as a single cell or as multiple cells. Battery 12 is desirably configured to provide a fully charged, operational voltage ($V_{batt}$) across its load in the range of 3.0 to 7.2 volts, but maybe other voltages in other embodiments. Thus, battery 12 supplies a voltage that is typical of Li-ion, NiCd, NiMH, and alkaline batteries or battery backs popularly used with a wide variety of portable electronic devices.

A portion of RF transmitting device 10 is implemented through components formed on a common semiconductor substrate 14 in accordance with a standard integrated circuit formation process. In a preferred embodiment, a standard complementary metal oxide semiconductor (CMOS) process is used to form these components. While standard CMOS processes may vary from manufacturer to manufacturer, such processes tend to reliably and efficiently produce low power circuits at high yields. But other semiconductor formation processes may also be used, perhaps in combination with a standard CMOS process.

Nothing requires all components of RF transmitting device 10 to be formed on semiconductor substrate 14. Thus, FIG. 1 depicts a raw data signal 16 as arriving on substrate 14 from the external environment. Raw data signal 16 is desirably configured to convey the information that is to be transmitted from RF transmitting device 10. The precise nature, configuration, encoding, or format of raw data signal 16 is unimportant for the purposes of the present application. Raw data signal 16 arrives at an RF input signal source 18 on semiconductor substrate 14.

RF input signal source 18 provides any signal processing needed to convert raw data signal 16 into an RF communication signal that is ready for amplification. In one embodiment, digital modulation, pulse shaping, upconversion, and bandpass filtering circuits are included in RF input signal source 18. In another embodiment, raw data signal 16 arrives on substrate 14 in an RF form, and RF input signal source 18 functions merely as a transmission channel. An RF input signal 20 is provided as an output of RF input signal source 18.

RF input signal 20 is referred to as an "input" because it is supplied to the input of one or more amplification stages. In particular, RF input signal 20 is provided to a metal oxide semiconductor (MOS) driver amplification stage 22. MOS driver amplification stage 22 is desirably configured as discussed below to form a particularly compact form of amplifier. MOS driver amplification stage 22 is referred below as RF amplifier 22.

In one embodiment, RF amplifier 22 supplies an RF output signal 24 to a bipolar output amplification stage 26. Bipolar output amplification stage 26 desirably uses conventional bipolar transistor formation processes to form an amplification stage that boosts the power of RF output signal 24 to a level that is currently impractical using standard CMOS processing techniques. Bipolar output amplification stage 26 generates a form of RF output signal 24, referred to as RF output signal 24', which propagates to an antenna 28 from which it is broadcast. Antenna 28 may, but is not required to reside on substrate 14. Although not shown, a duplexer, circulator, or other signal splitting component may be included along with receiving circuits so that RF transmitting device 10 also receives and demodulates RF signals.

Those skilled in the art will appreciate that a low-power embodiment of the present invention may desirably omit bipolar output amplification stage 26. In embodiments that omit bipolar output amplification stage 26, RF output signal 24 may be routed to antenna 28.

A conduction chain voltage controller 30 may also be formed on substrate 14. In the embodiment of RF transmitting device 10 depicted in FIG. 1, a negative terminal of battery 12 couples to a node 32 adapted to provide a first common potential, referred to herein as ground. A positive terminal of battery 12 couples to a node 34 adapted to provide a second common potential, referred to herein as $V_{batt}$, and to voltage controller 30. Voltage controller 30 is also coupled to RF amplifier 22 and to RF amplifier 26. Voltage controller 30 is configured to selectively provide battery voltage to RF amplifiers 22 and 26.

In the embodiment depicted in FIG. 1, conduction chain voltage controller 30 drives a node 36 adapted to provide a third common potential referred to as $V_{dd}$ herein. Voltage controller 30 is desirably configured to supply $V_{dd}$ in accordance with three operating modes. In a first mode, $V_{dd}$ exhibits substantially zero volts relative to ground node 32 across the load of RF amplifier 22. In other words, during this first mode, voltage controller 30 simulates a switch to ground. In a second mode, $V_{dd}$ exhibits a voltage as close to $V_{batt}$ as reasonably practical across the load of RF amplifier 22. For example, during the second mode of operation, voltage controller 30 simulates a closed switch, and $V_{dd}$ may be around the saturation voltage of a transistor less than $V_{batt}$. During a third mode, $V_{dd}$ follows a predetermined trajectory to transition between the first and second modes, or vice-versa. The signal supplied from voltage controller 30 to RF amplifier 26 may follow a similar plan as $V_{dd}$ node 36.

A control signal 38 may be supplied to conduction chain voltage controller 30 to indicate the mode in which voltage controller 30 should operate. In one embodiment, a time division duplex (TDD) communication system may be accommodated through the manipulation of control signal 38 by causing voltage controller 30 to operate in its first mode during time slots when RF transmitting device is not scheduled to transmit and in its second mode during time slots when RF transmitting device is scheduled to transmit.

Accordingly, conduction chain voltage controller 30 is substantially a switching device that may be more simply implemented than a voltage regulator and may occupy less area on substrate 14 than a voltage regulator. And, voltage controller 30 may be more efficient than a voltage regulator, which is desirable for a battery-operated device, such as RF transmitting device 10.

Figure 2:
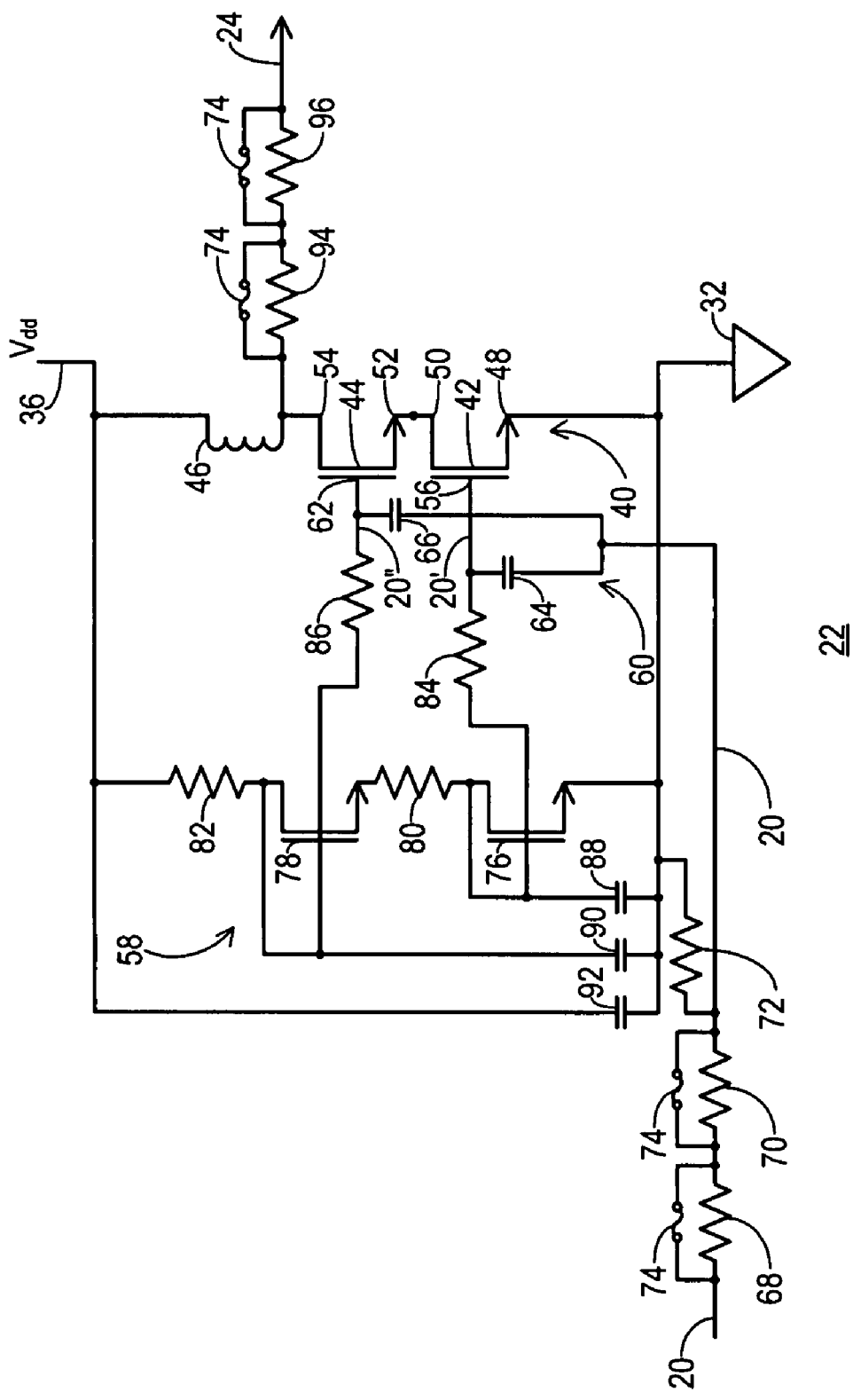
FIG. 2 shows a schematic diagram of a MOS driver amplification stage of the RF transmitting device depicted in FIG. 1.

FIG. 2 shows a schematic diagram of one embodiment of RF amplifier 22 in more detail than is shown in FIG. 1. Referring to RF amplifier 22 as depicted in FIGS. 1-2, a conduction chain 40 includes a transistor 42 stacked with a transistor 44 and an RF choke 46 between ground node 32 and $V_{dd}$ node 36. RF choke 46 is provided by an inductor. Transistors 42 and 44 are of a common type. In particular, a first conduction terminal 48 of transistor 42 couples to ground node 32, a second conduction terminal 50 of transistor 42 couples by way of a direct connection to a first conduction terminal 52 of transistor 44 in the embodiment depicted in FIGS. 1-2. A second conduction terminal 54 of transistor 44 supplies RF output signal 24 for RF amplifier 22 and couples to a first terminal of RF choke 46. A second terminal of RF choke 46 couples to $V_{dd}$ node 36.

The direct connection between transistors 42 and 44 in the embodiment depicted in FIGS. 1-2 is preferably implemented using a conductive path. In other words, preferably no lumped components, such as inductors, resistors, and the like, are located between transistors 42 and 44. Rather, the conductive path that interconnects transistors 42 and 44 exhibits only the small distributed, parasitic resistance, capacitance, and inductance associated with the conductive path. As a consequence of the direct connection, RF amplifier 22 saves space compared to RF amplifier designs that place inductors between stacked transistors. Those skilled in the art will appreciate that other embodiments may include other components between transistors 42 and 44.

A control terminal 56 of transistor 42 couples to an output of a control terminal bias network 58 and also to an output of an in-phase drive circuit 60. A control terminal 62 of transistor 44 couples to an output of control terminal bias network 58 and also couples to an output of in-phase drive circuit 60.

As discussed above, the components formed on substrate 14, including transistors 42 and 44, are desirably produced using a standard CMOS process. FIGS. 1-2 depict transistors 42 and 44 as being of a common type, and more particularly N-type MOS field effect transistors (FETs). For this N-type, MOS FET example, first conduction terminals 48 and 52 of transistors 42 and 44 are sources, second conduction terminals 50 and 54 of transistors 42 and 44 are drains, and control terminals 56 and 62 of transistors 42 and 44 are gates. But those skilled in the art will appreciate that different forms of transistors may be adapted for use in RF amplifier 22. For example, P-type transistors may be used, in which case the voltage polarities of Vdd node 36 and ground node 32 would have to be reversed from that discussed above. Or, bipolar transistors may be used, in which case base, collector, and emitter nomenclature may substitute for the gate, drain, and source nomenclature discussed above. Those skilled in the art will appreciate that the teaching of the present invention may be applied to a wide variety of diverse transistor structures. However, desirably both of transistors 42 and 44 are of a common type (e.g., N-type or P-type doping) so that they behave similarly when driven by in-phase versions of RF input signal 20.

In-phase drive circuit 60 receives RF input signal 20 at first terminals of blocking capacitors 64 and 66. A second terminal of blocking capacitor 64 supplies a first version of RF input signal 20, referred as RF input signal 20', to control terminal 56 of transistor 42. A second terminal of blocking capacitor 66 supplies a second version of RF input signal 20, referred as RF input signal 20", to control terminal 62 of transistor 44. Those skilled in the art will appreciate that blocking capacitors 64 and 66 pass RF input signal 20 but block any DC biasing that may be present at their second terminals. And, desirably any phase shift introduced into RF input signal 20' relative to RF input signal 20 is substantially equal to the phase shift introduced into RF input signal 20" relative to RF input signal 20. Accordingly, RF input signals 20' and 20" are in-phase with each other, and control terminals 56 and 62 of transistors 42 and 44 are driven by in-phase versions of RF input signal 20.

The use of in-phase versions of RF input signal 20 to drive transistors 42 and 44 allows transistors 42 and 44 to maintain substantially equal voltages across their respective conduction terminals both for DC bias conditions and for AC operating conditions. In particular, this drive strategy urges both of transistors 42 and 44 to do the same things at each instant of each RF signal cycle. And, unlike a cascode amplifier configuration, transistor 44 is driven at both its control terminal and one of its conduction terminals. It is believed that this additional drive mechanism at the control terminal increases gain while increasing output impedance under AC conditions. Drain 54 of transistor 44 operates at two times the voltage of drain 40 of transistor 42 for DC and RF operation. Transistors 42 and 44 each remain within their allowed DC operating range so reliability issues do not arise. The RF voltage capability is two times that of a single transistor and more RF power may be delivered by RF output signal 24.

FIG. 2 depicts an embodiment of RF amplifier 22 in which RF input signal 20 may be provided through a selectable voltage divider which includes resistors 68, 70, and 72. Each of resistors 68 and 70 is shunted by its own fuse 74, and resistor 72 is coupled to ground. This selectable voltage divider may be included in RF amplifier 22 to select the gain of RF amplifier 22. Gain may be reduced by blowing one or more of fuses 74.

In one embodiment, control terminal bias network 58 is configured to include only active components, resistors, and capacitors and to avoid the use of inductors. This configuration saves valuable area on semiconductor substrate 14. For example, FIG. 2 depicts an embodiment of control terminal bias network 58 that includes mirroring circuits 76 and 78 stacked with resistors 80 and 82 between $V_{dd}$ node 36 and ground node 32. Each of mirroring circuits 76 and 78 includes a transistor of the same type as transistors 42 and 44. A control terminal and a conduction terminal of this transistor are connected together so that the two conduction terminals of the transistor are fixed at a predetermined voltage, typically around 0.7 V. The two resistors 80 and 82 exhibit substantially the same resistance. The control terminals of mirroring circuits 76 and 78 respectively couple to control terminals 56 and 62 of transistors 42 and 44 through resistors 84 and 86, and the control terminals of mirroring circuits 76 and 78 are AC-shunted to ground node 32 through capacitors 88 and 90, respectively. Alternatively, capacitors 88 and 90 may shunt AC signals to $V_{dd}$ node 36, $V_{batt}$ node 34, or other nodes at low AC impedance to ground node 32.

Bias voltages are provided to control terminals 56 and 62 of transistors 42 and 44 through resistors 84 and 86. The bias voltage applied to control terminal 56 is roughly around 0.7 V above ground. More precisely, mirroring circuit 76 mirrors the voltage between control terminal 56 and conduction terminal 48 of transistor 42 as that voltage may change over temperature and time and does not rigidly provide a precise 0.7 V offset. The bias voltage applied to control terminal 62 is roughly around 0.7 V above the midpoint between $V_{dd}$ and ground. More precisely, mirroring circuit 78 mirrors the voltage between control terminal 62 and conduction terminal 52 of transistor 44 as that voltage may change over temperature and time and does not rigidly provide a precise 0.7 V offset. The bias voltages applied to control terminals 56 and 62 cause the voltage appearing across the conduction terminals of transistors 42 and 44 to be shared about equally. And, due to the in-phase driving of control terminals 56 and 62, this voltage that appears across transistors 42 and 44 remains about equally shared by transistors 42 and 44 even under operational conditions when an AC signal is being amplified.

The use of resistors 84 and 86 in control terminal bias network 58 to bias transistors 42 and 44 saves valuable area on semiconductor substrate 14, when compared to the use of inductors. But resistors 84 and 86 serve another beneficial role as well. In particular, resistors 84 and 86 are not sensitive to the frequencies of the signals that are presented to them. For example, lower frequency baseband modulation components of RF input signals 20' and 20" appearing at control terminals 56 and 62 see approximately the same impedance looking back toward mirroring circuits 76 and 78 as RF signal components. Due to capacitors 88 and 90 this impedance is predominately determined by resistors 84 and 86. Thus, baseband modulation is attenuated the same as RF. Consequently, baseband energy tends not to re-modulate the bias voltages appearing at control terminals 56 and 62, and the linearity of RF amplifier 22 improves.

The embodiment of RF amplifier 22 depicted in FIG. 2 shows a bypass capacitor 92 coupled between $V_{dd}$ node 36 and ground node 32. Those skilled in the art will appreciate that bypass capacitor 92 is useful for isolating $V_{dd}$ from RF signals and for otherwise reducing ripple in $V_{dd}$. Due to the MOS implementation of RF amplifier 22, bypass capacitor 92 may be of a reduced size compared to bypass capacitors conventionally used for bipolar amplifiers. In addition, the embodiment of RF amplifier 22 depicted in FIG. 2 shows series-connected resistors 94 and 96 coupled between conduction terminal 54 of transistor 44 and the output of RF amplifier 22. Each of resistors 94 and 96 is shunted by its own fuse 74. Thus, resistors 94 and 96 provide further gain selectivity for RF amplifier 22. In particular, the gain of RF amplifier 22 may be deliberately reduced by blowing one or more of fuses 74.

In summary, at least one embodiment of the present invention provides an improved compact RF amplifier, transmitting device, and method therefor. In at least one embodiment, the RF amplifier, transmitting device, and method include a conduction chain having stacked transistors and an RF choke, wherein the transistors are driven by in-phase versions of an RF input signal. Reasonable gain and output impedance are achieved, and roughly even voltage distribution tends to be maintained across the transistors at both DC and at RF conditions. In at least one embodiment, inductors are avoided in biasing networks for the transistors, and the stacked transistors are directly connected together. A compact RF amplifier results due at least in part to the scarce use of inductors.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A radio-frequency (RF) amplifier comprising:
a first transistor of a first type, said first transistor having a control terminal and first and second conduction terminals, wherein said first conduction terminal of said first transistor couples to a node adapted to provide a first common potential;
a second transistor of said first type, said second transistor having a control terminal and first and second conduction terminals, wherein said second conduction terminal of said first transistor couples to said first conduction terminal of said second transistor;
an RF choke coupled between said second terminal of said second transistor and a node adapted to provide a second common potential;
an in-phase drive circuit configured to provide in-phase versions of an RF input signal to said control terminals of said first and second transistors; and
a control terminal bias network coupled to said control terminals of said first and second transistors and to said first and second common potential nodes, said control terminal bias network being configured to establish substantially equal DC voltages across said first and second conduction terminals of each of said first and second transistors.

2. An amplifier as claimed in claim 1 wherein said first and second transistors are metal-oxide semiconductor (MOS) transistors.

3. An amplifier as claimed in claim 1 wherein said first and second transistors, said RF choke, said in-phase drive circuit, and said control terminal bias network are all formed on a common semiconductor substrate of an integrated circuit.

4. An amplifier as claimed in claim 1 wherein said second conduction terminal of said first transistor directly connects to said first conduction terminal of said second transistor.

5. An amplifier as claimed in claim 1 wherein said control terminal bias network comprises:
a first mirroring circuit;
a first resistor coupled between said first mirroring circuit and said control terminal of said first transistor;
a second mirroring circuit; and
a second resistor coupled between said second mirroring circuit and said control terminal of said second transistor.

6. An amplifier as claimed in claim 5 wherein said first current mirroring circuit couples to said node adapted to provide said first common potential, and said control terminal bias network comprises:
a third resistor coupled between said node adapted to provide said second common potential and said second current mirror circuit; and
a fourth resistor coupled between said first and second mirroring circuits.

7. An amplifier as claimed in claim 5 wherein said control terminal bias network comprises:
a first capacitor coupled between said first mirroring circuit and one of said nodes that are adapted to provide said first and second common potentials; and
a second capacitor coupled between said second mirroring circuit and one of said nodes that are adapted to provide said first and second common potentials.

8. An amplifier as claimed in claim 1 wherein:
said amplifier comprises a node adapted to receive said RF input signal; and
said in-phase drive circuit comprises a first capacitor coupled between said node adapted to receive said RF input signal and said control terminal of said first transistor, and a second capacitor coupled between said node adapted to receive said RF input signal and said control terminal of said second transistor.

9. An amplifier as claimed in claim 1 wherein said second conduction terminal of said second transistor is configured to provide an RF output signal.

10. An amplifier as claimed in claim 9 wherein:
said first and second transistors are metal-oxide semiconductor (MOS) transistors;
said first and second MOS transistors, said RF choke, said in-phase drive circuit, and said control terminal bias network collectively form a driver amplification stage; and
said amplifier additionally comprises a bipolar output amplification stage having an input adapted to receive said RF output signal.

11. An amplifier as claimed in claim 1 wherein:
said first and second transistors are metal-oxide semiconductor (MOS) transistors;
each of said first and second MOS transistors are configured to exhibit a breakdown voltage between said first and second conduction terminals in the range of 2.8-3.6 V; and
said amplifier additionally comprises a conduction chain voltage controller coupled to said nodes that provide said first and second common potentials, said conduction chain voltage controller being configured so that a steady-state voltage difference between said first and second common potentials is between one and two times said breakdown voltage.

12. A method of amplifying an RF input signal comprising:
providing a conduction chain with stacked first and second transistors of a common type and an RF choke on one another so that a first conduction terminal of said first transistor couples to a first node adapted to provide a first common potential, a second conduction terminal of said first transistor couples to a first conduction terminal of said second transistor, and a second conduction terminal of said second transistor couples through said RF choke to a second node adapted to provide a second common potential;
biasing said first and second transistors to establish substantially equal DC voltages across said first and second conduction terminals of said first and second transistors; and
applying in-phase versions of said RF input signal to control terminals of said first and second transistors.

13. A method as claimed in claim 12 wherein said providing, biasing, and applying activities are carried out using components formed on a common semiconductor substrate.

14. A method as claimed in claim 12 additionally comprising supplying an RF output signal from said second conduction terminal of said second transistor.

15. A method as claimed in claim 12 wherein said providing, biasing, and applying activities cause linear amplification of said RF input signal.

16. A RF transmitting device comprising:
a battery;
an RF input signal source configured to generate an RF input signal;
a first metal oxide semiconductor (MOS) transistor of a first type, said first MOS transistor having a control terminal and first and second conduction terminals, wherein said first conduction terminal of said first MOS transistor couples to said battery;
a second metal oxide semiconductor (MOS) transistor of said first type, said second MOS transistor having a control terminal and first and second conduction terminals, wherein said second conduction terminal of said first MOS transistor couples to said first conduction terminal of said second MOS transistor;
an RF choke coupled between said second terminal of said second MOS transistor and said battery;
an in-phase drive circuit configured to provide in-phase versions of said RF input signal to said control terminals of said first and second MOS transistors;
a control terminal bias network coupled to said control terminals of said first and second MOS transistors and to said battery, said control terminal bias network being configured to establish substantially equal DC voltages across said first and second conduction terminals of each of said first and second MOS transistors; and
an antenna coupled to said second conduction terminal of said second MOS transistor.

17. A device as claimed in claim 16 wherein said control terminal bias network comprises:
a first mirroring circuit;
a first resistor coupled between said first mirroring circuit and said control terminal of said first MOS transistor;
a second mirroring circuit; and
a second resistor coupled between said second mirroring circuit and said control terminal of said second MOS transistor.

18. A device as claimed in claim 17 wherein said first mirroring circuit couples to said battery, and said control terminal bias network comprises:
a third resistor coupled between said battery and said second mirroring circuit;
a fourth resistor coupled between said first and second mirroring circuits;
a first capacitor coupled between said first mirroring circuit and said battery; and
a second capacitor coupled between said second mirroring circuit and said battery.

19. A device as claimed in claim 16 wherein:
said first and second MOS transistors, said RF choke, said in-phase drive circuit, and said control terminal bias network collectively form a pre-driver circuit; and
said device additionally comprises a bipolar amplification stage coupled between second conduction terminal of said second MOS transistor and said antenna.

20. A device as claimed in claim 16 wherein:
each of said first and second MOS transistors are configured to exhibit a breakdown voltage between said first and second conduction terminals in the range of 2.8-3.6 volts;
said battery exhibits a fully charged, operational voltage in the range of 3.0 to 7.2 volts; and
said device additionally comprises a conduction chain voltage controller coupled between said battery and said RF choke, said conduction chain voltage controller being configured so that a steady-state voltage difference applied between said RF choke and said first conduction terminal of said first MOS transistor is between one and two times said breakdown voltage.

* * * * *